(12) United States Patent
Ahn (10) Patent No.: US 9,397,249 B2
(45) Date of Patent: *Jul. 19, 2016

(54) PHOTODETECTOR CAPABLE OF DETECTING LONG WAVELENGTH RADIATION

(71) Applicant: UNIVERSITY OF SEOUL INDUSTRY COOPERATION FOUNDATION, Seoul (KR)

(72) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/322,695

(22) Filed: Jul. 2, 2014

(65) Prior Publication Data

US 2015/0333211 A1    Nov. 19, 2015

Related U.S. Application Data

(62) Division of application No. 12/498,228, filed on Jul. 6, 2009, now Pat. No. 8,809,834.

(51) Int. Cl.
| | | |
|---|---|---|
| *H01L 21/00* | (2006.01) | |
| *H01L 31/112* | (2006.01) | |
| *G02B 6/122* | (2006.01) | |
| *G02B 6/13* | (2006.01) | |
| *H01L 31/0232* | (2014.01) | |
| *H01L 31/18* | (2006.01) | |
| *B82Y 20/00* | (2011.01) | |

(52) U.S. Cl.
CPC ............ *H01L 31/112* (2013.01); *G02B 6/1226* (2013.01); *G02B 6/131* (2013.01); *H01L 31/0232* (2013.01); *H01L 31/02327* (2013.01); *H01L 31/1804* (2013.01); *H01L 31/184* (2013.01); *H01L 31/1828* (2013.01); *B82Y 20/00* (2013.01); *Y10S 977/765* (2013.01)

(58) Field of Classification Search
CPC ................................................... H01L 31/0232
USPC ..................... 438/69; 257/14, 257
See application file for complete search history.

(56) References Cited

U.S. PATENT DOCUMENTS

| | | | |
|---|---|---|---|
| 3,920,860 | A | 11/1975 | Freller et al. |
| 3,990,096 | A | 11/1976 | Namizaki et al. |
| 4,764,261 | A | 8/1988 | Ondris et al. |
| 5,079,774 | A | 1/1992 | Mendez et al. |
| 5,112,410 | A | 5/1992 | Chen |
| 5,175,739 | A | 12/1992 | Takeuchi et al. |
| 5,181,219 | A | 1/1993 | Mori et al. |

(Continued)

FOREIGN PATENT DOCUMENTS

| | | |
|---|---|---|
| CN | 101405866 | 4/2009 |
| JP | S61218194 | 9/1986 |

(Continued)

OTHER PUBLICATIONS

U.S. Appl. No. 13/485,241, filed May 31, 2012, Ahn.

(Continued)

*Primary Examiner* — Edward Wojciechowicz
(74) *Attorney, Agent, or Firm* — Dorsey & Whitney LLP (57) ABSTRACT

Apparatuses capable of and techniques for detecting long wavelength radiation are provided.

20 Claims, 7 Drawing Sheets

(56) References Cited

U.S. PATENT DOCUMENTS

| | | | |
|---|---|---|---|
| 5,181,221 A | 1/1993 | Mori et al. | |
| 5,182,757 A | 1/1993 | Mori et al. | |
| 5,287,377 A | 2/1994 | Fukuzawa et al. | |
| 5,291,506 A | 3/1994 | Ahn et al. | |
| 5,291,507 A | 3/1994 | Haase et al. | |
| 5,295,148 A | 3/1994 | Mori et al. | |
| 5,317,584 A | 5/1994 | Mori et al. | |
| 5,349,464 A | 9/1994 | Ishihara et al. | |
| 5,404,027 A | 4/1995 | Haase et al. | |
| 5,404,369 A | 4/1995 | Mori et al. | |
| 5,490,953 A | 2/1996 | Morita | |
| 5,563,902 A | 10/1996 | Xu et al. | |
| 5,576,221 A | 11/1996 | Takemura et al. | |
| 5,606,176 A | 2/1997 | Nitta | |
| 5,646,419 A | 7/1997 | McCaldin et al. | |
| 5,685,919 A | 11/1997 | Saito et al. | |
| 5,818,072 A | 10/1998 | Schetzina | |
| 5,933,444 A | 8/1999 | Molva et al. | |
| 6,069,380 A | 5/2000 | Chou et al. | |
| 6,301,282 B1 | 10/2001 | Capasso et al. | |
| 6,328,655 B1 | 12/2001 | Zimmermann et al. | |
| 6,501,783 B1 | 12/2002 | Capasso et al. | |
| 6,515,313 B1 | 2/2003 | Ibbetson et al. | |
| 6,627,914 B1 | 9/2003 | Komiyama et al. | |
| 6,713,832 B2 | 3/2004 | Pardo et al. | |
| 6,798,552 B2 | 9/2004 | Tada | |
| 6,803,596 B2 | 10/2004 | Hata | |
| 6,813,063 B2 | 11/2004 | Ishihara | |
| 6,891,329 B2 | 5/2005 | Nagano et al. | |
| 6,956,808 B2 | 10/2005 | Miyanishi et al. | |
| 7,420,225 B1 | 9/2008 | Wanke et al. | |
| 7,638,817 B2 | 12/2009 | Shur et al. | |
| 7,656,928 B2 | 2/2010 | Furuyama | |
| 7,733,936 B2 | 6/2010 | Okamoto | |
| 8,086,108 B2 | 12/2011 | Tanigawa et al. | |
| 8,183,656 B2 | 5/2012 | Okamoto et al. | |
| 8,227,793 B2 | 7/2012 | Ahn | |
| 8,367,925 B2 | 2/2013 | Ahn | |
| 8,368,047 B2 | 2/2013 | Ahn | |
| 8,368,990 B2 | 2/2013 | Ahn | |
| 8,369,370 B2 | 2/2013 | Lell et al. | |
| 8,373,153 B2 | 2/2013 | Ahn | |
| 8,395,141 B2 | 3/2013 | Ahn | |
| 8,524,517 B2 | 9/2013 | Ahn | |
| 8,681,411 B2 | 3/2014 | Ahn | |
| 8,748,862 B2 | 6/2014 | Ahn | |
| 8,802,481 B2 * | 8/2014 | Ahn | 438/69 |
| 2002/0031153 A1 | 3/2002 | Niwa et al. | |
| 2002/0150135 A1 | 10/2002 | Naone et al. | |
| 2003/0010979 A1 | 1/2003 | Pardo et al. | |
| 2003/0039446 A1 | 2/2003 | Hutchinson et al. | |
| 2004/0058467 A1 | 3/2004 | Chirovsky et al. | |
| 2004/0095978 A1 | 5/2004 | Cheng et al. | |
| 2004/0109483 A1 | 6/2004 | Simpson et al. | |
| 2004/0183087 A1 | 9/2004 | Gardner | |
| 2004/0232412 A1 | 11/2004 | Burgener, II et al. | |
| 2005/0074576 A1 | 4/2005 | Chaiken et al. | |
| 2005/0185686 A1 | 8/2005 | Rupasov et al. | |
| 2005/0285128 A1 | 12/2005 | Scherer et al. | |
| 2006/0244003 A1 | 11/2006 | Ueda | |
| 2007/0063304 A1 | 3/2007 | Matsumoto et al. | |
| 2007/0126021 A1 | 6/2007 | Ryu et al. | |
| 2007/0126037 A1 | 6/2007 | Ikeda | |
| 2007/0194297 A1 | 8/2007 | McCarthy et al. | |
| 2007/0298551 A1 | 12/2007 | Bouvet et al. | |
| 2008/0048193 A1 | 2/2008 | Yoo et al. | |
| 2008/0197366 A1 | 8/2008 | Yoo et al. | |
| 2009/0017268 A1 | 1/2009 | Skipor et al. | |
| 2009/0020149 A1 | 1/2009 | Woods et al. | |
| 2009/0106583 A1 | 4/2009 | Kawamura | |
| 2009/0114940 A1 | 5/2009 | Yang et al. | |
| 2009/0121628 A1 | 5/2009 | Cho et al. | |
| 2009/0220017 A1 | 9/2009 | Kawamura | |
| 2009/0273820 A1 | 11/2009 | Dionne et al. | |
| 2009/0310640 A1 | 12/2009 | Sato et al. | |
| 2010/0013040 A1 | 1/2010 | Okamoto et al. |
| 2010/0096001 A1 | 4/2010 | Sivananthan et al. |
| 2010/0155696 A1 | 6/2010 | Duan et al. |
| 2010/0200941 A1 | 8/2010 | Fujikata et al. |
| 2010/0261338 A1 | 10/2010 | Tsakalakos et al. |
| 2010/0276661 A1 | 11/2010 | Ahn |
| 2010/0301308 A1 | 12/2010 | Ahn |
| 2010/0301454 A1 | 12/2010 | Zhang et al. |
| 2010/0326489 A1 | 12/2010 | Ahn |
| 2011/0001121 A1 | 1/2011 | Ahn |
| 2011/0001124 A1 | 1/2011 | Ahn |
| 2011/0001125 A1 | 1/2011 | Ahn |
| 2011/0043884 A1 | 2/2011 | Ahn |
| 2011/0095309 A1 | 4/2011 | Ahn |
| 2011/0114995 A1 | 5/2011 | Ahn |
| 2012/0040483 A1 | 2/2012 | Ahn |
| 2013/0141770 A1 | 6/2013 | Ahn |

FOREIGN PATENT DOCUMENTS

| | | |
|---|---|---|
| JP | H03108379 A | 5/1991 |
| JP | H03248479 A | 11/1991 |
| JP | H410669 | 1/1992 |
| JP | H0572584 | 3/1993 |
| JP | H05235488 | 9/1993 |
| JP | H0613487 | 1/1994 |
| JP | H06095180 A | 4/1994 |
| JP | H06196745 A | 7/1994 |
| JP | H0786688 A | 3/1995 |
| JP | H07133200 A | 5/1995 |
| JP | 07-202340 | 8/1995 |
| JP | H07231113 | 8/1995 |
| JP | H08264821 A | 10/1996 |
| JP | 09199783 | 7/1997 |
| JP | H10215029 | 8/1998 |
| JP | H10303452 | 11/1998 |
| JP | 2000138420 A | 5/2000 |
| JP | 2001501433 A | 1/2001 |
| JP | 2001291929 | 10/2001 |
| JP | 2003092455 | 3/2003 |
| JP | 2003520438 | 7/2003 |
| JP | 2004140113 | 5/2004 |
| JP | 2005521266 A | 7/2005 |
| JP | 2006039214 A | 2/2006 |
| JP | 2006210620 | 8/2006 |
| JP | 2006259064 A | 9/2006 |
| JP | 2006332598 A | 12/2006 |
| JP | 2006344673 | 12/2006 |
| JP | 07202340 | 8/2007 |
| JP | 2008056511 | 3/2008 |
| JP | 2008171835 | 7/2008 |
| JP | 2009032770 | 2/2009 |
| JP | 2011507289 | 3/2011 |
| JP | 2012528481 | 11/2012 |
| WO | 0217011 A1 | 2/2002 |
| WO | 2008075542 A1 | 6/2008 |
| WO | WO 2008072688 | 6/2008 |
| WO | 2009067540 A1 | 5/2009 |
| WO | WO 2009067347 | 5/2009 |
| WO | 2009080012 | 7/2009 |
| WO | WO 2009106583 | 9/2009 |
| WO | WO 2010137865 | 12/2010 |
| WO | WO 2011004990 | 1/2011 |

OTHER PUBLICATIONS

A. Jia, et al. "Design of a new UV/blue/green light emitters made of hexagonal-phase ZnMgCdOSSe mixed-crystal system fabricated on GaAs- and InP-(1 1 1) substrates" Journal of Crystal Growth 214/215 (2000) pp. 1085-1090.

Al-Salim, Najeh, Synthesis of CdSeS Nanocrystals in Coordinating and Noncoordinating Solvents: Solvent's Role in Evolution of the Optical and Structural Properties, Mar. 26, 2007.

Alda, Javier et al., "Optical antennas for nano-photonic applications," vol. 16, No. 5, Trends on Nanothecnology. TNT2004. Phantoms Foundations. Segovia (Spain). Sep. 13-17, 2004, http://www.iop.org/EJ/abstract/0957-4484/16/5/017.

(56) References Cited

OTHER PUBLICATIONS

Arup Neogi, et al. "Enhancement of spontaneous recombination rate in a quantum well by resonant surface plasmon coupling" Physical Review B, vol. 66 (2002) pp. 153305-1-153305-4.
Australian Patent Office; International Search Report and Written Opinion in corresponding PCT application (PCT/KR2010/007292); mailed Jan. 26, 2011.
B. Ullrich, Semiconductor Science and Technology "Green emission and bandgap narrowing due to two-photon excitation in thin film CDS formed by spray pyrolysis", published Jun. 22, 2011.
Chul Huh, et al., "Improvement in light-output efficiency of InGaN/GaN multiple-quantum well light-emitting diodes by current blocking layer", Appl. Phys., vol. 92, No. 5, Sep. 1, 2002, 2248-2250, American Institute of Physics.
D. Ahn, et al. "Electric field dependence of instrasubband polar-optical-phonon scattering in a quantum well" Physical Review B, vol. 37, No. 5, Feb. 15, 1988-I, pp. 2529-2535.
D. Ahn, et al. "A field-effect quantum-well laser with lateral current injection". J.Appl. Phys. 64(1). 1 July 2998, 440-442, American Institue of Physics.
D. Ahn, et al. "Optical Gain and Luminescence of a ZnO—MgZnO Quantum Well" IEEE Photonics Technology Letters vol. 18, No. 2, Jan. 15, 2006 pp. 349-351.
D-M. Yeh, et al "Surface plasmon coupling effect in an InGaN/GaN single-quantum-well light-emitting diode" Appl. Phys. Lett. 91, 171103 (2007).
Doyeol Ahn, et al. "Non-Markovian Gain of Strained-Layer Wurtzite GaN Quantum-Well Lasers with Many-Body Effects" IEEE Journal of Selected Topics in Quantum Electronics, vol. 4, No. 3, May/Jun. 1998, pp. 520-526.
Doyeol Ahn, "Theory of Non-Markovian Gain in Strained-Layer Quantum-Well Lasers with Many-Body Effects" IEEE Journal of Quantum Electronics, vol. 34, No. 2, Feb. 1998, pp. 344-352.
Doyeol Ahn, "Time-convolutionless reduced-density-operator theory of an arbitrary driven system coupled to a stochastic reservoir: Quantum kinetic equations for semiconductors" Physical Review B, vol. 50, No. 12, Sep. 15, 1994-II, pp. 8310-8318.
Doyeol Ahn, "Time-convolutionless reduced-density-operator theory of an arbitrary driven system coupled to a stochastic reservoir. II. Optical gain and line-shape function of a driven semiconductor" Physical Review B, vol. 51, No. 4, Jan. 15, 1995-II, pp. 2159-2166.
E. H. Sargent, et al "Lateral Injection Lasers" International Journal of High Speed Electronics and Systems, Dec. 1998, vol. 9, No. 4, pp. 941-978.
Fujikata, J., et al., "Waveguide-Integrated Si Nano-Photodiode with Surface-Plasmon Antenna and its Application to On-chip Optical Clock Distribution," Applied Physics Express , vol. 1 , pp. 176-178 (2008).
Hetterich J., et al, Optimized Design of Plasmonic MSM Photodetector, IEEE Journal of Quantum Electronics Oct. 2007, vol. 43, No. 10, pp. 855 to 859.
Hoang, T. et al., "A high efficiency lateral light emitting device on SOI," Electron Devices for Microwave and Optoelectronic Applications, EDMO 2004, 12th International Symposium, Nov. 8-9, 2004, pp. 87-91.
Hyunsoo Kim, et al., "Lateral current transport path, a model for GaN-based light-emitting diodes; application to practical device designs", Appl. Phys. Lett., vol. 81, No. 7, Aug. 12, 2002, 1326-1328, American Institute of Physics.
I.V. Bradley et al. "Space-charge effects in type-II strained layer superlattices" Journal of Crystal Growth 184/185 (1998) pp. 728-731.
J. Ueno, et al. "MBE growth of AnSe/MgCdS and ZnCdS/MgCdS superlattices for UV-A sensors" Phys. Stat. Sol. (c) 3, No. 4, pp. 1225-1228 (2006).
Jie Liu, et al. "AlGaN/GaN/InGaN/GaN DH-HEMTs with an InGaN Notch for Enhanced Carrier Confinement" IEEE Electron Device Letters, vol. 27, No. 1, Jan. 2006, pp. 10-12.
Leosson, K., et al. "Long-range surface plasmon polariton nanowire waveguides for device applications" Optics Express, vol. 14, No. 1, Jan. 9, 2006 pp. 314-319.
Koichi Okamoto, et al. "Surface-plasmon-enhanced light emitters based on InGaN quantum wells" Nature Materials, vol. 3, Sep. 2004, pp. 601-605.
LEDs Magazine, "Goldeneye sets brightness benchmark for green LEDs", http://www.ledsmagazine.com/news/5/5/18, May 15, 2008, 2 pages.
Liu Liu, et al. "Novel surface plasmon waveguide for high integration" Optics Express, vol. 13, No. 17, Aug. 22, 2005 pp. 6645-6650.
P.I. Kuznetsov, et al. "Hexagonal ZnCdS epilayers and CdSSe/ZnCdS SQ structures on CdS(0001) and ZnCdS (0001) substrates grown by MOVPE" Physica E, vol. 17 (2003) pp. 516-517.
P. Waltereit, et al., Nitride semiconductors free of electrostatic fields for efficient white light-emitting diodes, Nature, vol. 406, Aug. 24, 2000, 865-868, Macmillan Magazines Ltd.
R. Paschotta "Encyclopedia of Laser Physics and Technology, vol. 1", Wiley-VCH, 2008, ISBN 3527408282, 9783527408283 p. 595.
S. Bai, et al. "Determination of the electric field in 4H/3C/4H-SiC quantum wells due to spontaneous polarization in the 4H SiC matrix" Appl. Phys. Lett. 83, 3171 (2003).
Seong-Ran Jeon, et al., "GaN tunnel junctions as a current aperture in a blue surface-emitting light-emitting diode", Appl. Phys. Lett., vol. 80, No. 11, Mar. 18, 2002, 1933-1935, American Institute of Physics.
Seong-Ran Jeon, et al., "Lateral current spreading in GaN-based light-emitting diodes utilizing tunnel contact junctions", Appl. Phys. Lett., vol. 78, No. 21, May 21, 2001, 3265-3267, American Institute of Physics.
Seoung-Hwan Park, "Crystal Orientation Effects in Electronic Properties of Wurtzite GaN/AlGaN Quantum Wells with Spontaneous and Piezoelectric Polaritzation", Jpn. J. Appl. Phys. vol. 39, Part 1, No. 6A, Jun. 2000, 3478-3482, The Japan Society of Applied Physics.
Seoung-Hwan Park, et al., "Crystal-orientation effects on the piezoelectric field and electronic properties of strained wurtzite semiconductors", vol. 59, No. 7, Feb. 15, 1999, 4725-4737, The American Physical Society.
Seoung-Hwan Park, et al. "Many-body optical gain and intraband relaxation time of wurtzite InGaN/GaN quantum-well lasers and comparison with experiment" Applied Physics Letters 87, 044103 (2005).
Seoung-Hwan Park, et al. "Many-body optical gain of wurtzite GaN-based quantum-well lasers and comparison with experiment" Appl. Phys. Lett. 72 (3), Jan. 19, 1998, pp. 287-289.
Seoung-Hwan Park, et al. "Optical gain in InGaN/InGaAlN quantum well stuctures with zero internal field" Applied Physics Letters, vol. 92, 171115 (2008) pp. 171115-1-171115-3.
Seoung-Hwan Park, et al. "Piezoelectric effects on electrical and optical properties of wurtzite GaN/AlGaN quantum well lasers" Applied Physics Letters vol. 72, No. 24, Jun. 15, 1998, pp. 3103-3105.
Seoung-Hwan Park, et al. "Spontaneous and piezoelectric polarization effects in wurtzite ZnO/MgZnO quantum well lasers" Applied Physics Letters, vol. 87, 253509 (2005) pp. 253509-1-253509-3.
Sergey I. Bozhevolnyi, et al. "Channel Plasmon-Polariton Guiding by Subwavelength Metal Grooves" Physical Review Letters, vol. 95, 046802, Jul. 22, 2005, pp. 046802-1-046802-4.
Siliconfareast.com; "Lattice Constants"; http://www.siliconfareast.com/lattice_constants.htm; 2 pages; retrieved Oct. 7, 2011.
Smith S.J. et al., "Lateral light emitting n-i-p diodes in InSb/AlxIn1—xSb quantum wells," Applied Physics Letters, vol. 89, p. 111118 (2006), 3 pages.
Sumith, B. et al., Quantum Well Infrared Photodetectors for Long Wavelength Infrared Applications Proceedings of SPIE, Oct. 1998, vol. 3436, Infrared Technology and Applications XXIV, pp. 280 to 284.
Taguchi, T., et al., Ultraviolet Laser and Photodetector of CdZnS/ZnS Multiple Quantum Wells, Physica B. 1993, vol. 191, pp. 136 to 139.
Tsung-Hsing Yu, et al. "Theoretical study of the two-dimensional electron mobility in strained III-nitride heterostructures" Journal of Applied Physics, vol. 89, No. 7, Apr. 1, 2001, pp. 3827-3834.
Wikipedia; "Wurtzite crystal structure", http://en.wikipedia.org/wiki/Wurtzite_crystal_structure; 1 page; retrieved Oct. 7, 2011.

(56) References Cited

OTHER PUBLICATIONS

Wikipedia; "Zinc Selenide", http://en.wikipedia.org/wiki/Zinc_selenide; 3 pages; available as of Mar. 15, 2013.
Yifei Zhang, et al. "Charge control and mobility studies for an AiGan/GaN high electron mobility transistor" Journal of Applied Physics, vol. 85, No. 1, Jan. 1, 1999, pp. 587-594.
Yu, E.T., et al., Plasmonic Nanoparticle Scattering for Enhanced Performance of Photocoltaic and Photodetector Devices, Proceeding of SPIE, Aug. 28, 2008, vol. 7033, Plasmonics: Nanoimaging, Nanofabrication and their Application IV, pp. 70331V-1 to 70331V-9.
"II-VI solar cells moving to the production phase," Photovoltaics Bulletin., (2003), vol. 2003, No. 11, Oct. 2003, pp. 10-12.
Andreani, Lucio Claudio, et al, Exchange interaction and polariton effects in quantum-well excitons, Physical Review B, vol. 41, No. 11, pp. 7536-7544 (1990).
Angelakis, D. G., et al., "Photon-blockade-induced Mott transitions and XY spin models in coupled cavity arrays," Phys. Rev. A76, 031805 (2007).
Chu, T.L., and Chu, S.S., "Thin film II-VI photovoltaics," vol. 38, Issue 3, Mar. 1995, pp. 533-549.
Compaan, A. D., et al., "Sputtered II-VI Alloys and Structures for Tandem PV," Subcontract Report NREL/SR-520-43954, Sep. 2008, pp. 64.
Gogolin, O., et al., Temperature dependence of exciton peak energies in Cui quantum dots, Solid State Communications, vol. 122, pp. 511-513 (2002).
Goosen, K.W., "Excitonic electroabsorption in extremely shallow quantum wells," Appl. Phys. Lett., vol. 57, Issue 24, pp. 2582-2584, accepted for publication Oct. 1, 1990.
Greentree, A.D., et al., "Quantum phase transitions of light," Nature Physics 2, pp. 856-861 (2006).
Hartmann, M.J., and Plenio, M.B., "Strong Photon Nonlinearities and Photonic Mott Insulators," Physical Review Letters, vol. 99, Issue 10, Sep. 7, 2007, pp. 103601-1 to 103601-4.
Kawazoe, T., and Masumoto, Y., "Luminescence Hole Burning and Quantum Size Effects of Charged Excitons in CuCl Quantum Dots," Physical Review Letters, vol. 77, Issue 24, pp. 4942-4945 (1996).
Klimov, V.I., et al., "Optical Gain and Stimulated Emission in Nanocrystal Quantum Dots," Science, Oct. 13, 2000, vol. 290, No. 5490, pp. 314-317.
Little, R. B., et al., "Formation of quantum-dot quantum-well heteronanostructures with large lattice mismatch: ZnS/CdS/ZnS" Journal of Chemical Physics, vol. 114, No. 4, 2001, pp. 1813-1822.
Masumoto, Y., et al., "Observation of persistent spectral hole burning in CuBr quantum dots," Physical Review B, vol. 52, No. 7, pp. 4688-4691 (1995).
Obloh, H., "Group III-nitride based blue emitters," Advances in Solid State Physics, vol. 38, 15-28 (1999).
Park, S.-H., et al., "Internal field engineering in CdZnO/MgZnO quantum well structures," Applied Physics Letters, vol. 94, Issue:8, pp. 083507, 1-3 (2009).
Ricker, T., "Samsung's "world's smallest" 8.4 megapixel CMOS sensor: so long CCD?," accessed at http://www.engadget.com/2007/03/27/samsungs-worlds-smallest-8-4-megapixel-cmos-sensor-so-long/, Mar. 27, 2007, pp. 4.
Tassone, F., et al, "Quantum-well reflectivity and exciton-polariton dispersion," Physical Review B, vol. 45, No. 11, pp. 6023-6030 (1992).
Valenta, J., et al., "Hole-filling of persistent spectral holes in the excitonic absorption band of CuBr quantum dots," Applied Physics Letters, vol. 70, No. 6, pp. 680-682 (1997).
Williams, R.S., et al., "Growth and luminescence spectroscopy of a CuCl quantum well structure," Journal of Vacuum Science and Technology A: Vaccum, Surfaces and Films, vol. 6, No. 3, pp. 1950-1952 (1988).
Hernández, F. E. et al., "High Performance Optical Limiter," accessed at http://web.archive.org/web/20050429144449/http://www.ieee.org/organizations/pubs/newsletters/leos/dec00/high.htm, accessed on May 7, 2012, pp. 5.

Shakya, J., et al., "Switching characteristics of III-Nitride blue/green micro-LEDs," The Smithsonian/NASA Astrophysics Data System, American Physical Society, Annual March Meeting, Mar. 12-16, 2001.
S X. Jin, et al., "Size dependence of III-nitride microdisk light-emitting diode characteristics," Applied Physics Letters, May 28, 2001, vol. 78, No. 22, pp. 3532-3534.
International Search Report and Written Opinion, mailed Aug. 10, 2010, as issued in connection with Patent Application No. PCT/KR2011/003322, filed on May 26, 2010.
International Search Report and Written Opinion, mailed Sep. 10, 2010, as issued in connection with Patent Application No. PCT/KR2010/004350, filed on Jul. 5, 2010.
International Search Report and Written Opinion for International Application No. PCT/KR2010/002649 mailed on Jul. 26, 2010.
International Search Report and Written Opinion for International Application No. PCT/KR2010/005600 mailed on Oct. 22, 2010.
International Search Report and Written Opinion for International Application No. PCT/KR2010/008118 mailed on Feb. 11, 2011.
Nishida, N., et al. "Heteroepitaxy of CuCl on GaAs and Si substrates," Surface Science, vol. 324, Issue 2-3, pp. 149-158 (1995).
Yanase, A. and Segawa, Y., "Stranski-Krastanov growth of CuCl on MgO(001)," Surface Science, vol. 367, Issue 1, pp. L1-L7 (1996).
Takata, M., et al., "MBE growth condition of CuC1 thin filims and their optical properties," CAMP 14th, pp. 27-30 (2003).
U.S. Appl. No. 12/472,168, Jun. 18, 2010, Office Action.
U.S. Appl. No. 12/472,168, Jul. 21, 2010, Office Action.
U.S. Appl. No. 12/472,168, Jan. 5, 2011, Office Action.
U.S. Appl. No. 12/472,168, Feb. 22, 2011, Notice of Allowance.
U.S. Appl. No. 12/472,168, Aug. 18, 2011, Notice of Allowance.
U.S. Appl. No. 12/472,168, Sep. 1, 2011, Notice of Allowance.
U.S. Appl. No. 12/472,168, Mar. 29, 2012, Notice of Allowance.
U.S. Appl. No. 12/472,168, May 29, 2012, Notice of Allowance.
U.S. Appl. No. 12/472,168, Oct. 1, 2012, Notice of Allowance.
U.S. Appl. No. 12/472,168, Jan. 23, 2013, Issue Notification.
U.S. Appl. No. 12/493,800, Jan. 20, 2012, Office Action.
U.S. Appl. No. 12/493,800, Apr. 26, 2012, Office Action.
U.S. Appl. No. 12/493,800, Oct. 4, 2012, Notice of Allowance.
U.S. Appl. No. 12/493,800, Jan. 16, 2013, Issue Notification.
U.S. Appl. No. 12/498,265, May 17, 2011, Office Action.
U.S. Appl. No. 12/498,265, Aug. 26, 2011, Office Action.
U.S. Appl. No. 12/498,265, Feb. 28, 2012, Office Action.
U.S. Appl. No. 12/498,265, Aug. 17, 2012, Office Action.
U.S. Appl. No. 12/498,265, Mar. 15, 2013, Office Action.
U.S. Appl. No. 12/498,265, May 21, 2013, Office Action.
U.S. Appl. No. 12/498,265, Sep. 20, 2013, Notice of Allowance.
U.S. Appl. No. 12/498,265, Jan. 31, 2014, Notice of Allowance.
U.S. Appl. No. 12/498,265, May 21, 2014, Issue Notification.
U.S. Appl. No. 12/498,228, Sep. 1, 2010, Office Action.
U.S. Appl. No. 12/498,228, Dec. 23, 2010, Office Action.
U.S. Appl. No. 12/498,228, Jul. 12, 2011, Office Action.
U.S. Appl. No. 12/498,228, Dec. 15, 2011, Notice of Allowance.
U.S. Appl. No. 12/498,228, Sep. 16, 2013, Notice of Allowance.
U.S. Appl. No. 12/498,228, Mar. 28, 2014, Notice of Allowance.
U.S. Appl. No. 12/498,204, Apr. 26, 2011, Office Action.
U.S. Appl. No. 12/498,204, Jul. 21, 2011, Notice of Allowance.
U.S. Appl. No. 12/498,204, Jul. 28, 2011, Notice of Allowance.
U.S. Appl. No. 12/498,204, Oct. 25, 2011, Notice of Allowance.
U.S. Appl. No. 12/498,204, Feb. 1, 2012, Office Action.
U.S. Appl. No. 12/498,204, Mar. 26, 2012, Notice of Allowance.
U.S. Appl. No. 12/498,204, May 29, 2012, Notice of Allowance.
U.S. Appl. No. 12/498,204, Jul. 4, 2012, Issue Notification.
U.S. Appl. No. 12/498,257, Nov. 23, 2011, Office Action.
U.S. Appl. No. 12/498,257, Jul. 3, 2012, Office Action.
U.S. Appl. No. 12/498,257, Nov. 15, 2012, Notice of Allowance.
U.S. Appl. No. 12/498,257, Feb. 20, 2013, Issue Notification.
U.S. Appl. No. 12/545,678, Dec. 16, 2011, Office Action.
U.S. Appl. No. 12/545,678, Jun. 20, 2012, Notice of Allowance.
U.S. Appl. No. 12/545,678, Oct. 2, 2012, Notice of Allowance.
U.S. Appl. No. 12/545,678, Jan. 16, 2013, Issue Notification.
U.S. Appl. No. 12/606,880, Apr. 29, 2011, Office Action.
U.S. Appl. No. 12/606,880, Aug. 15, 2011, Notice of Allowance.
U.S. Appl. No. 12/606,880, Nov. 17, 2011, Notice of Allowance.

(56) References Cited

OTHER PUBLICATIONS

U.S. Appl. No. 12/606,880, Feb. 16, 2012, Notice of Allowance.
U.S. Appl. No. 12/606,880, May 23, 2012, Notice of Allowance.
U.S. Appl. No. 12/606,880, Aug. 31, 2012, Notice of Allowance.
U.S. Appl. No. 12/606,880, Oct. 3, 2012, Notice of Allowance.
U.S. Appl. No. 12/606,880, Jan. 16, 2013, Issue Notification.
U.S. Appl. No. 13/279,945, Jan. 25, 2013, Notice of Allowance.
U.S. Appl. No. 13/279,945, May 6, 2013, Notice of Allowance.
U.S. Appl. No. 13/279,945, Aug. 14, 2013, Issue Notification.
U.S. Appl. No. 13/758,115, May 15, 2013, Notice of Allowance.
U.S. Appl. No. 13/758,115, Sep. 5, 2013, Notice of Allowance.
U.S. Appl. No. 13/758,115, Dec. 24, 2013, Notice of Allowance.
U.S. Appl. No. 13/758,115, Mar. 5, 2014, Issue Notification.
U.S. Appl. No. 13/485,241, Oct. 28, 2013, Notice of Allowance.
U.S. Appl. No. 13/485,241, Apr. 7, 2014, Notice of Allowance.
U.S. Appl. No. 12/498,228, Jul. 30, 2014, Issue Notification.
U.S. Appl. No. 13/485,241, Jul. 23, 2014, Issue Notification.

Faist, J., et al., "Quantum Cascade Laser," Science, vol. 264, pp. 553-556 (Apr. 22, 1994).
Colombelli, R., et al., "Far-infrared surface-plasmon quantum-cascade lasers at 21.5 µm and 24 µm wavelengths," Applied Physics Letter, vol. 78, Issue 18, pp. 2620-2622 (2001).
Sirtori, C., et al., "Long-wavelength ($\lambda \approx$8-11.5 µm) semiconductor lasers with waveguides based on surface plasmons," Optics Letters, vol. 23, Issue 17, 1366-1368 (1998).
Tredicucci, A., et al., "Single-mode surface-plasmon laser," Applied Physics Letter, vol. 76, Issue 16, pp. 2164-2166 (2000).
Schubert, E. F., "Visible-spectrum LEDs," in Light-Emitting Diodes, 1st Edition, Chapter 8, pp. 155-177, aambridge University Press, (2003).
Sze, S.M., "Modern Semiconductor Device Physics," Chapter 7, pp. 409-472, John Wiley & Sons, Inc. (1998).
Sze, S.M., "Physics of Semiconductor Devices," 2nd Edition, Chapter 13, pp. 743-789, John Wiley & Sons, Inc. (Sep. 30, 1981).

\* cited by examiner

PHOTODETECTOR CAPABLE OF DETECTING LONG WAVELENGTH RADIATION

CROSS-REFERENCE TO RELATED APPLICATIONS

This application is a division under 35 U.S.C. §121 of U.S. application Ser. No. 12/498,228 filed on 6 Jul. 2009, now U.S. Pat. No. 8,809,834, the disclosure of which is incorporated herein, in its entirety, by this reference.

BACKGROUND

Detection of long wavelength radiation at room-temperature has several useful applications, including military and civil uses. For example, photodetectors for detecting long wavelength radiation can be used in medical equipment, as seekers in missiles, in narcotics control, etc. As nano-technology involving the design of nano-scale electronics including optical devices and photodetectors (i.e., structures having a size of about 100 nm or smaller) continues to develop, it is envisioned that advances in nano-technology may be applied to the design of such nano-scale electronics (i.e., optical devices and photodetectors) for improved efficiency and detection.

SUMMARY

Apparatuses capable of and techniques for detecting long wavelength radiation (e.g., infrared spectrum light) are provided. In one embodiment, a photodetector capable of detecting long wavelength radiation includes a source disposed on a proximal end, a drain disposed on a distal end, at least one nano-assembly coupling the source and the drain between the proximal and distal ends, at least two surface plasmon waveguides positioned between the source and the drain and juxtaposed to the at least one nano-assembly in a longitudinal direction of the at least one nano-assembly, and wherein one of the at least two surface plasmon waveguides is positioned along a first side of the at least one nano-assembly, and another of the at least two surface plasmon waveguides is positioned along a second side of the at least one nano-assembly that is opposite the first side.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Figure 1:
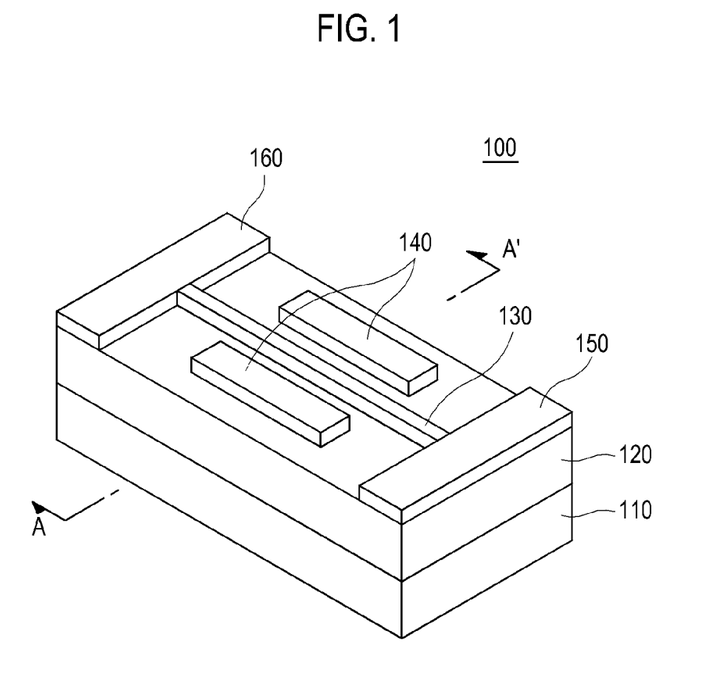
FIG. 1 shows a perspective view of an illustrative embodiment of a photodetector.

FIG. 1 shows a perspective view of an illustrative embodiment of a photodetector 100 that may be used to detect long wavelength radiation (e.g., infrared spectrum light). As depicted in FIG. 1, photodetector 100 may be formed on a stacked structure of a substrate 110 and an insulation layer 120. Further, a nano-assembly 130, surface plasmon waveguides (hereinafter referred to as "SP waveguides") 140, a source 150 and a drain 160 may be arranged on insulation layer 120. In one embodiment, at least two SP waveguides 140 are arranged between source 150 and drain 160 which are disposed on proximal and distal ends of the stacked structure, respectively. For example, source 150 and drain 160 may be disposed on proximal and distal ends of insulation layer 120, respectively. When incident light is received, nano-assembly 130 may operate as a channel that interconnects source 150 and drain 160 so that a predetermined current may flow in an external circuit (not shown) coupled to photodetector 100.

SP waveguides 140 may be positioned between source 150 and drain 160 and juxtaposed to nano-assembly 130 in a longitudinal direction of nano-assembly 130. Further, one SP waveguide 140 may be positioned along a first side of nano-assembly 130 and another SP waveguide 140 may be positioned along a second side of nano-assembly 130 that is opposite the first side, defining at least some space between SP waveguides 140 and nano-assembly 130, which may be several to thousands of nanometers. The alternating arrangement of nano-assembly 130 and SP waveguides 140 provides an interface to receive photons from incident light and allows the photons to be effectively confined around nano-assembly 130 between SP waveguides 140, as will be further described below in conjunction with FIG. 4. In one embodiment, the space between SP waveguides 140 and nano-assembly 130 may be filled with a dielectric material such as porcelain (ceramic), mica, glass, plastics, the oxides of various metals, or air, but may include any type of dielectric material. SP waveguides 140 may include any type of metal material such as Ag, Al, Au, Ni, or Ti.

In one embodiment, source 150 and drain 160 may include any metal, silicide, or semiconductors such as silicon, germanium, II-VI semiconductor compounds, or III-V semiconductor compounds. Examples of applicable II-VI semiconductor compounds may include CdS, CdSe, CdTe, ZnS, ZnSe, ZnTe, HgS, HgSe, HgTe, CdZnSe, CdSSe, or ZnSSe, and examples of III-V semiconductor compounds may include GaAs, InP, GaP, AlGaAs, or GaN.

Figure 2:
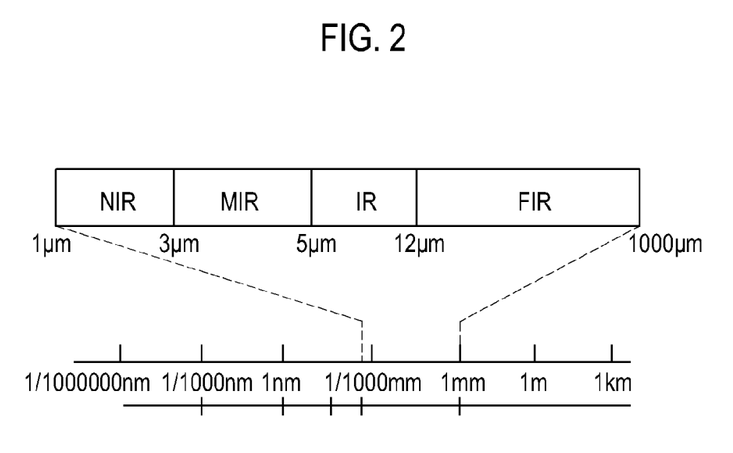
FIG. 2 shows the spectrum of long wavelength radiation that may be detected in an illustrative embodiment.

FIG. 2 shows the spectrum of long wavelength radiation that may be detected by photodetector 100. As shown in FIG. 2, long wavelength radiation may include the radiation of light having a wavelength that is more than or equal to several μm's. Detecting such long wavelength radiation is useful in various applications, including both military and civil applications. For example, detection of near-infrared radiation ("NIR" having a wavelength ranging from about 1 μm to about 3 μm) at room-temperature may be useful for detecting cancer. Detection of mid-infrared radiation ("MIR" having a wavelength ranging from about 3 μm to about 5 μm) at room-temperature may be applied to many military applications such as seekers in missiles. Detection of infrared radiation ("IR" having a wavelength ranging from about 8 μm to about 12 μm) at room-temperature may be employed in both military and civil applications for applications such as human body detection. Further, detecting far-infrared ("FIR" having a wavelength of more than several tens of μm's) at room-temperature may be used for narcotics control.

Figure 3:
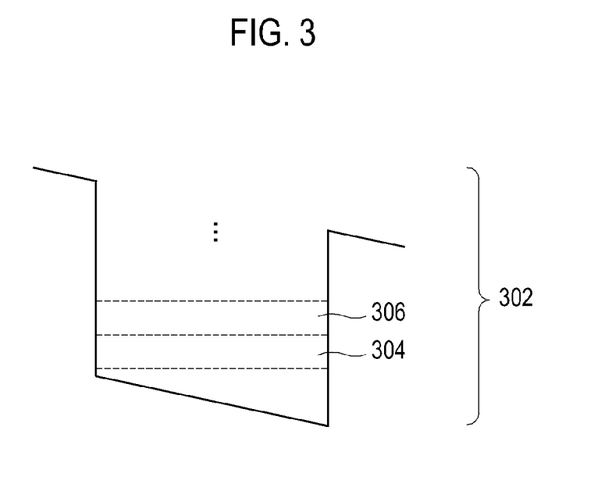
FIG. 3 is a conceptual view of an illustrative embodiment of an intersubband transition within a conduction band of a nano-assembly.

FIG. 3 is a conceptual view of an illustrative embodiment of an intersubband transition within a conduction band of nano-assembly 130. Photodetector 100 may detect long wavelength radiation by using intersubband transitions within a conduction band of nano-assembly 130. As shown in FIG. 3, a conduction band 302 of nano-assembly 130 may have several intersubbands 304 and 306. When a photon having energy corresponding to an intersubband energy gap between intersubbands 304 and 306 impinges on conduction band 302, electrons in conduction band 302 may transition from lower intersubband 304 (i.e., ground state) to upper intersubband 306, causing an electric current through photodetector 100. The photon may have energy in the range of from several meV to hundreds of meV.

Figure 4:
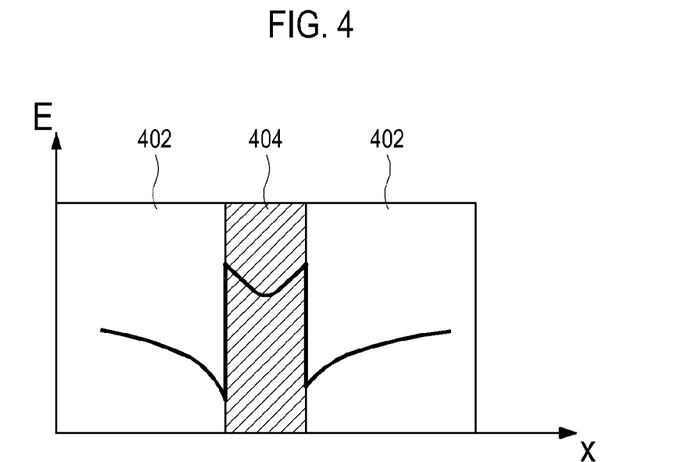
FIG. 4 is a graph showing electric field intensity of photons confined in an interface of an illustrative embodiment of the photodetector.

FIG. 4 illustrates a graph showing electric field intensity of photons confined in an interface of photodetector 100, which includes SP waveguides 140 and nano-assembly 130 arranged between SP waveguides 140. In FIG. 4, while regions 402 corresponding to SP waveguides 140 include metal material, a region 404 corresponding to nano-assembly 130 include dielectric material, as also shown in FIG. 1. Further, while the x-axis indicates the horizontal position of nano-assembly 130 and SP waveguides 140, the y-axis indicates electric field intensity. The graph shown in FIG. 4 illustrates that a substantial portion of the optical field produced by incident light (i.e., photons) is confined within region 404. The electric field confined between regions 402 and region 404 may be explained by Equation 1 shown below.

$$\frac{D_{x\_dielectric}}{D_{x\_metal}} = \frac{\varepsilon_{dielectric}E_{x\_dielectric}}{\varepsilon_{metal}E_{x\_metal}} = 1 \quad \text{[Equation 1]}$$

$$\therefore \frac{E_{x\_dielectric}}{E_{x\_metal}} = \frac{\varepsilon_{metal}}{\varepsilon_{dielectric}}$$

where $D_{x\_metal}$ and $D_{x\_dielectric}$ respectively refer to electric displacement fields in region 402 (corresponding to metal material included in SP waveguides 140) and region 404 (corresponding to dielectric material included in nano-assembly 130), $E_{x\_metal}$ and $E_{x\_dielectric}$ respectively refer to electric fields in region 402 and region 404, and $\varepsilon_{metal}$ and $\varepsilon_{dielectric}$ respectively refer to the permittivity of region 402 and region 404.

In Equation 1, since the value of $\varepsilon_{metal}$ is much greater than the value of $\varepsilon_{dielectric}$, $E_{x\_dielectric}$ becomes greater than $E_{x\_metal}$, which means that a substantial portion of the optical field is confined within region 404.

Referring to FIG. 4 and Equation 1, the electric field of the incident photons confined between SP waveguides 140 (i.e., nano-assembly 130) is substantially proportional to the ratio between the permittivity of SP waveguides 140 and the permittivity of nano-assembly 130 (and/or dielectric material filled between SP waveguides 140). Thus, the desired confinement of the electrical field may be obtained by selecting material(s) of appropriate permittivity for SP waveguides 140 and/or nano-assembly 130, even in the case where the width of nano-assembly 130 and/or the height of SP waveguides 140 are smaller than the wavelength of incident photons. In such an embodiment, SP waveguides 140 may be fabricated from one or more various types of metals. As shown in Equation 2 below, the permittivity $\varepsilon_{metal}$ of a metal is a function of frequency and, thus, the type of metal used may depend on the frequency of the photons that are to be detected by photodetector 100. The types of metal may be chosen based on the wavelength to be detected by photodetector 100. In one embodiment, a compound such as Ag, Al, Au, Ni, Ti or any other appropriate metal may be selected for long wavelength detection.

$$\varepsilon_{metal}(\omega) = 1 - \frac{\omega_p^2}{\omega^2} \quad \text{[Equation 2]}$$

where symbol $\omega_p$ represents plasma frequency of collective oscillations of the free conduction electrons.

Figure 5:
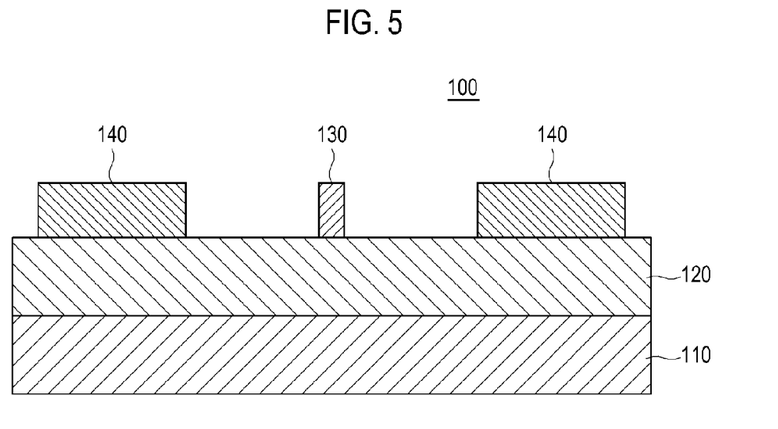
FIG. 5 shows a cross-sectional view of an illustrative embodiment of the photodetector of FIG. 1.

FIG. 5 shows a cross-sectional view of photodetector 100 taken along line A-A' in FIG. 1. In FIG. 5, the cross-sectional dimensions of nano-assembly 130 are on the nanometer scale. In some embodiments, nano-assembly 130 may have a width from about 10 nm to about 500 nm, such as about 10 nm, about 20 nm, about 50 nm, about 100 nm, about 200 nm, or about 500 nm, and a length from about 0.5 μm to about 5 μm, such as about 0.5 μm, about 1 μm, about 2 μm, about 3 μm, about 4 μm or about 5 μm. In other embodiments, nano-assembly 130 may have a width from about 30 nm to about 300 nm, a width-to-thickness ratio from about 5 to about 10 and a length of up to a few millimeters. The width and length of nano-assembly 130 may be varied substantially in various embodiments. Nano-assembly 130 may be a nano-wire, a nano-belt, a nano-rod, etc.

In one embodiment, nano-assembly 130 may include semiconductor material (hereinafter referred to as "nano-material") such as Si, InAs, or ZnO. The materials of nano-assembly 130 may be selected depending on the range of radiation wavelength to be detected. Table 1 shows the characteristics (i.e., an intersubband energy gap and a wavelength to be detected) of the nano-materials.

TABLE 1

| Material | Intersubband Energy Gap | Wavelength |
| --- | --- | --- |
| ZnO | about 50 meV | about 25 μm |
| Si | about 100 meV | about 12 μm |
| InAs | about 300 meV | about 4.5 μm |

Referring to Table 1, the wavelengths that may be detected using the nano-materials ZnO, Si, and InAs are about 25 μm, about 12 μm, and about 4.5 μm, respectively. Based on these wavelengths, nano-materials ZnO, Si, and InAs are suitable for detecting FIR, IR, and MIR, respectively. Other appropriate nano-material(s) may be applied to photodetector 100 for detecting the desired wavelength radiation.

In some embodiments, the thickness of SP waveguide 140 ranges from about 2 μm to about 3 μm to obtain a fine confinement of the photons. Although SP waveguide 140 is shown as having a rectangular shape in FIG. 1, the shape and dimensions of SP waveguide 140 may be varied according to each application. For example, each of SP waveguides 140 may have be a slab, rib or ridge shape for use in photodetector 100.

Figure 6:
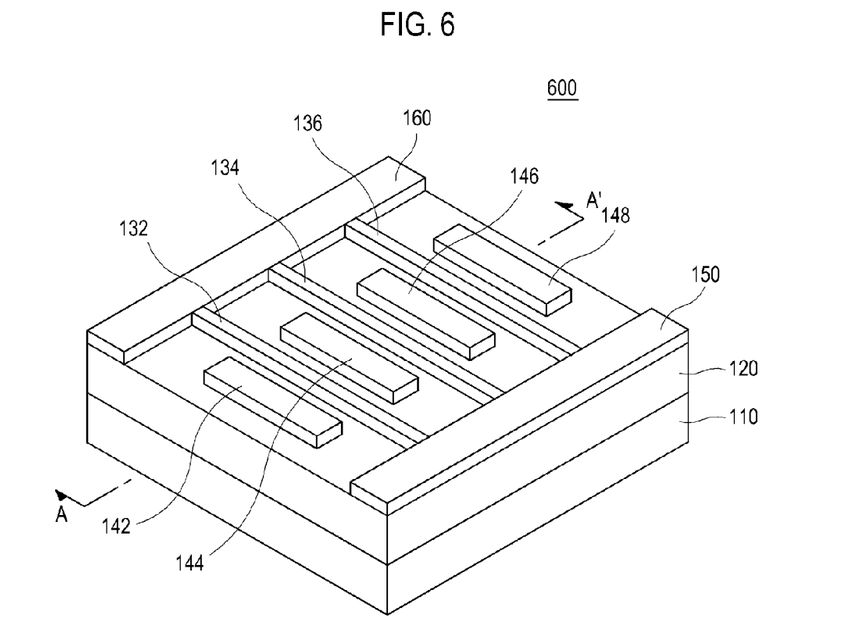
FIG. 6 shows a perspective view of an illustrative embodiment of a photodetector having nano-assemblies spaced apart from SP waveguides.

FIG. 6 shows a perspective view of an illustrative embodiment of a photodetector 600 having nano-assemblies spaced apart from SP waveguides. Referring to FIG. 6, photodetector 600 includes three nano-assemblies 132, 134 and 136 and four SP waveguides 142, 144, 146 and 148. SP waveguides 144 and 146 may be interposed between nano-assemblies 132, 134 and 136 to create an alternating arrangement of nano-assemblies 132, 134 and 136 and SP waveguides 144 and 146. In one embodiment, nano-assemblies 132, 134 and 136 may each include the same type of nano-material. In this case, photodetector 600 may be suitable for detecting one specific wavelength range corresponding to the nano-material. By using nano-assemblies 132, 134 and 136, photodetector 600 may quickly detect a desired wavelength radiation, while collecting more photons from an incident light. In another embodiment, each of nano-assemblies 132, 134 and 136 may include a different type of nano-material. In an illustrative embodiment where nano-assemblies 132, 134 and 136 include different nano-materials (e.g., ZnO, Si, and InAs, respectively), photodetector 600 may be suitable for detecting different ranges of wavelengths (e.g., FIR, IR, MIR). In this case, a separate drain may be provided for each of nano-assemblies 132, 134 and 136 so that an external circuit connected to each drain can detect different ranges of wavelengths.

Figure 7:
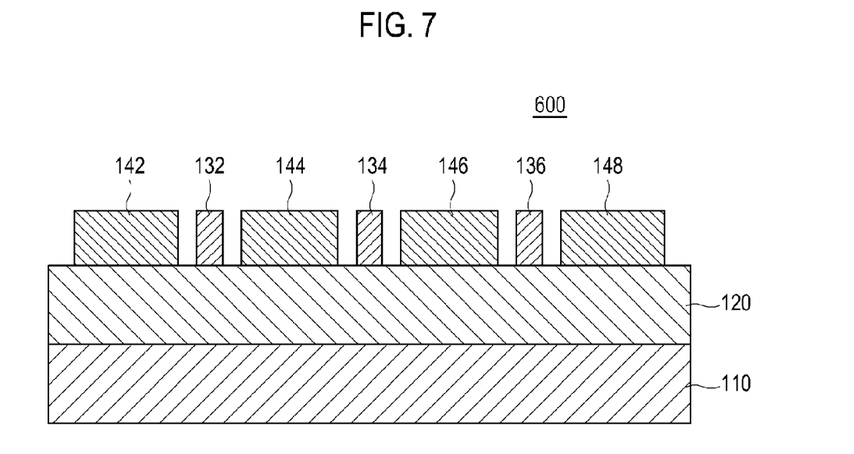
FIG. 7 shows a cross-sectional view of the photodetector of FIG. 6.

FIG. 7 shows a cross-sectional view of photodetector 600, which is taken along line A-A' of FIG. 6. Referring to FIG. 7, photodetector 600 has a laminated structure in which a substrate 110, an insulation layer 120, nano-assemblies 132, 134 and 136 (or SP waveguides 142, 144, 146 and 148) are sequentially stacked. In one embodiment, substrate 110 may include glass, silicon or quartz. Insulation layer 120 may include silicon dioxide ($SiO_2$), a fluorosilicate glass (FSG), a tetraethyl orthosilicate (TEOS) oxide, a silanol (SiOH), a flowable oxide (FOx), a bottom anti-reflective coating (BARC), an anti-reflective coating (ARC), a photoresist (PR), a near-frictionless carbon (NFC), a silicon carbide (SiC), a silicon oxycarbide (SiOC), and/or a carbon-doped silicon oxide (SiCOH). While nano-assemblies 132, 134 and 136 may include nano-material such as Si, InAs, or ZnO, SP waveguides 140 may include any type of metal material including Ag, Al, Au, Ni, or Ti. In FIG. 7, nano-assemblies 132, 134 and 136 are arranged alternately with SP waveguides 142, 144, 146 and 148 on insulation layer 120 so that each of nano-assemblies 132, 134 and 136 are spaced apart from its adjacent SP waveguides 142, 144, 146 and 148.

Figure 8:
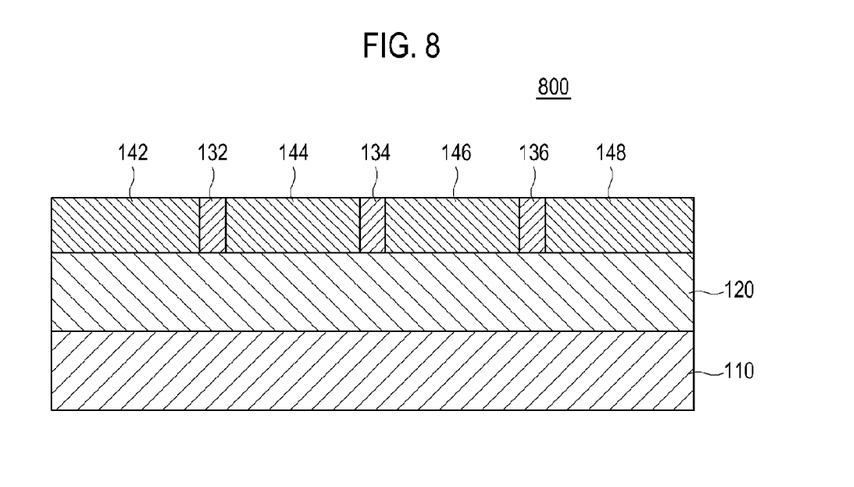
FIG. 8 shows a cross-sectional view of another illustrative embodiment of a photodetector having nano-assemblies placed in contact with SP waveguides.

FIG. 8 shows a cross-sectional view of an illustrative embodiment of a photodetector 800 having nano-assemblies placed in contact with SP waveguides. Referring to FIG. 8, photodetector 800 includes nano-assemblies 132, 134 and 136 arranged alternatingly and placed into contact with SP waveguides 142, 144, 146 and 148. The alternating arrangement of nano-assemblies 132, 134 and 136 and SP waveguides 142, 144, 146 and 148 as shown in FIG. 8 provides an interface to receive incident light where dielectric media is sandwiched between metal materials.

Figure 9:
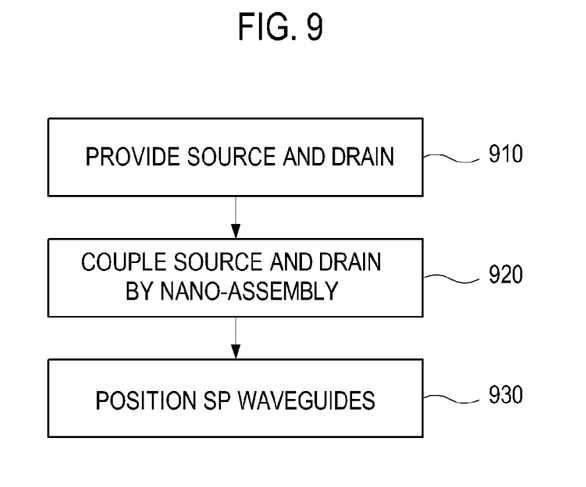
FIG. 9 shows a flow diagram of an illustrative embodiment of a method for providing a photodetector that detects long wavelength radiation.

FIG. 9 illustrates a flow diagram of an illustrative embodiment of a method for providing a photodetector that detects long wavelength radiation. In block 910, a source and a drain are provided and may be fabricated using any of a variety of well-known fabrication techniques such as chemical vapor deposition, photolithographic, or etching techniques. In block 920, the source and the drain are coupled by at least one nano-assembly, which may be grown between the source and the drain using any of a variety of suitable techniques such as epitaxial growth techniques, or amorphously deposited by any suitable deposition techniques. Illustrative techniques for applying the coatings include molecular beam epitaxy (MBE), metal-organic chemical vapor deposition (MOCVD), chemical vapor deposition (CVD) or plasma enhanced CVD (PECVD).

Figure 10:
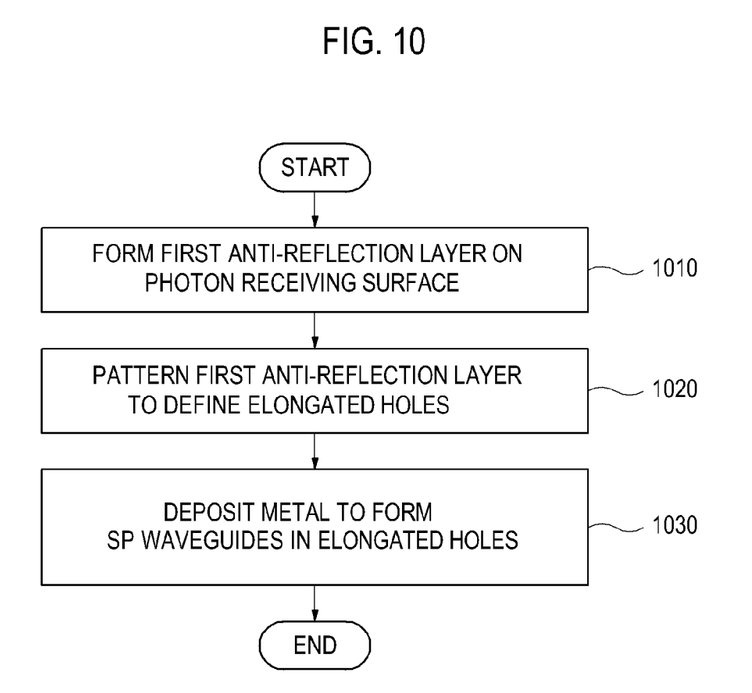
FIG. 10 shows a flow diagram of an illustrative embodiment of a method for providing SP waveguides.
Figure 11A:
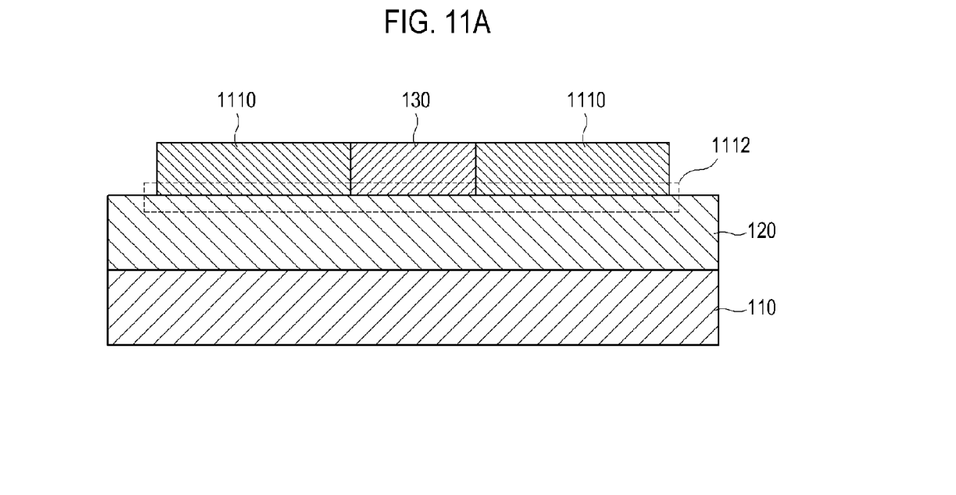
FIGS. 11A-11C are a series of diagrams illustrating the method shows in FIG. 10
Figure 11B:
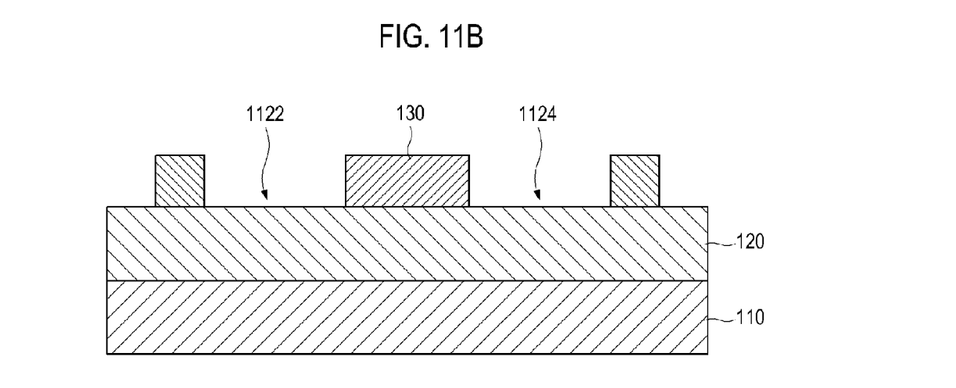
Figure 11C:
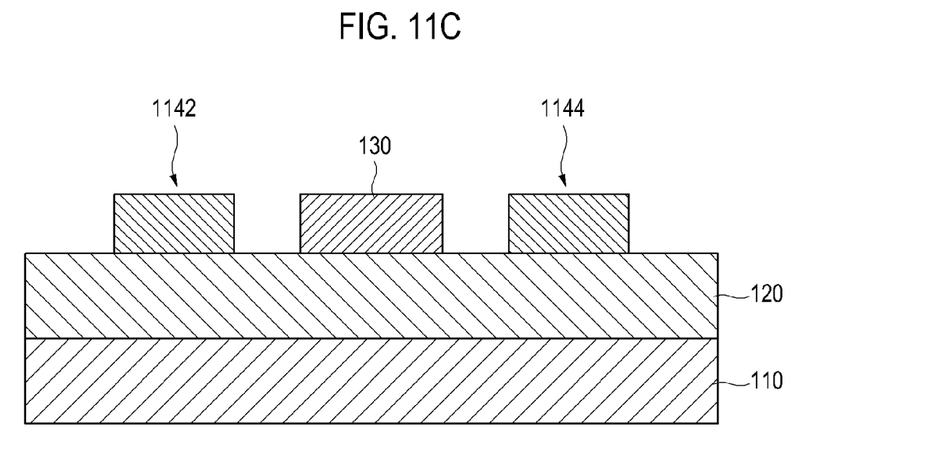

In block 930, SP waveguides may be provided and positioned juxtaposed to the nano-assembly in a longitudinal direction of nano-assembly so that one of the SP waveguides is positioned along a first side of nano-assembly and another of the SP waveguides is positioned along a second side of nano-assembly that is opposite the first side. FIG. 10 is a flow diagram of an illustrative embodiment of a method for providing SP waveguides. FIGS. 11A-11C are a series of diagrams illustrating the method shown in FIG. 10. Referring to FIG. 10, in block 1010, as shown in FIG. 11A, a first anti-reflection layer 1110 is formed on a photon receiving surface 1112 on insulation layer 120. In one embodiment, photon receiving surface 1112 may be a portion of the top surface of insulation layer 120. In block 1020, as shown in FIG. 11B, first anti-reflection layer 1110 is patterned to define therein two elongated holes 1122 and 1124. For example, first anti-reflection layer 1110 may be patterned by first forming a photo mask with patterns corresponding to two elongated holes 1122 and 1124, etching first anti-reflection layer 1110, and then removing the photo mask. In block 1030, as shown in FIG. 11C, metal is deposited into two elongated holes 1122 and 1124 (shown in FIG. 11B) to respectively form two SP waveguides 1142 and 1144 therein. Such deposition may be performed, for example, by using suitable masking and deposition techniques known in the art. SP waveguides 1142 and 1144 may be obtained by using any of a variety of well-known techniques such as a metal etching.

It should be appreciated that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, will be apparent. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, it should be appreciated that these terms translate from the plural to the singular and/or from the singular to the plural as is appropriate to the context and/or application. The various singular/plural permutations may be expressly set forth herein for sake of clarity.

It should be further appreciated that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It should be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, it should be recognized that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one would understand the convention (e.g., "a system having at least one of A, B, or C" would include but not be limited to systems that have A alone, B alone, C alone, A and B together, A and C together, B and C together, and/or A, B, and C together, etc.). It should be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, it is recognized that the disclosure is also thereby described in terms of any individual member or subgroup of members of the Markush group.

It should be further understood, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. It should also be understood that all language such as "up to," "at least," and the like include the number recited and refer to ranges which can be subsequently broken down into subranges as discussed above. Finally, it should also be understood that a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A method for assembling a photodetector capable of detecting long wavelength radiation, the method comprising:
   providing a source and a drain;
   coupling the source and the drain with at least one nano-assembly;
   positioning at least two surface plasmon waveguides between the source and the drain and juxtaposing to the at least one nano-assembly in a longitudinal direction of the at least one nano-assembly; and
   wherein one of the at least two surface plasmon waveguides is positioned along a first side of the at least one nano-assembly, and another of the at least two surface plasmon waveguides is positioned along a second side of the at least one nano-assembly that is opposite the first side.

2. The method of claim 1, further comprising forming the at least one nano-assembly by epitaxial growth.

3. The method of claim 1, further comprising:
   providing a substrate;
   preparing an insulation layer on the substrate on which the source and the drain are positioned.

4. The method of claim 1, wherein the at least two surface plasmon waveguides are positioned to receive photons from incident light and to confine at least a portion of the photons around at least a portion of the nano-assembly.

5. The method of claim 1, wherein at least one of the at least two surface plasmon waveguides is in contact with the at least one nano-assembly.

6. The method of claim 1, wherein at least one of the at least two surface plasmon waveguides is spaced from the at least one nano-assembly.

7. The method of claim 1, wherein the at least one nano-assembly is configured to have at least one intersubband such that at least one transition of electrons in the at least one intersubband corresponds to detection of a photon.

8. The method of claim 1, wherein the source and the drain are spaced from each other.

9. The method of claim 1, wherein the at least one nano-assembly includes at least one of a nanowire, a nanobelt, or a nanorod.

10. The method of claim 1, wherein the at least one nano-assembly includes an array of at least one of a nano-wire, a nanobelt, or a nanorod.

11. The method of claim 1, wherein the at least one nano-assembly includes at least one material selected from the group consisting of ZnO, Si, and InAs.

12. The method of claim 1, wherein the at least one nano-assembly includes a plurality of nano-assemblies each of which is fabricated from different types of material.

13. The method of claim 1, wherein at least one of the at least two surface plasmon waveguides is fabricated from a metallic material.

14. The method of claim 13, wherein the metallic material includes silver.

15. The method of claim 1, wherein the long wavelength radiation has a wavelength of at least 1 µm.

16. The method of claim 1, wherein the at least one nano-assembly has a width of about 10 nm to about 500 nm and a length of about 0.5 µm to about 5 µm.

17. A method for manufacturing a photodetector capable of detecting long wavelength radiation, the method comprising:
    forming a source and a drain;
    growing at least one nano-assembly that couples the source and the drain, the at least one nano-assembly includes a first side and a second side that is generally opposite the first side; and
    positioning a first surface plasmon waveguide between the source and the drain and along the first side of the at least one nano-assembly;
    positioning a second surface plasmon waveguide between the source and drain and along the second side of the at least one nano-assembly.

18. The method of claim 17, wherein the at least two surface plasmon waveguides are positioned to receive photons from incident light and to confine at least a portion of the photons around at least a portion of the nano-assembly.

19. A method for manufacturing a photodetector capable of detecting long wavelength radiation, the method comprising:
    forming a source and a drain;
    growing at least one nano-assembly that couples the source and the drain, the at least one nano-assembly includes a first side and a second side that is generally opposite the first side; and
    positioning a first surface plasmon waveguide between the source and the drain and along the first side of the at least one nano-assembly; and
    positioning a second surface plasmon waveguide between the source and drain and along the second side of the at least one nano-assembly;
    wherein the first and second surface plasmon waveguides are positioned to receive photons from incident light and to confine at least a portion of the photons around at least a portion of the nano-assembly.

20. The method of claim 19, wherein growing at least one nano-assembly that couples the source and the drain includes epitaxially growing the at least one nano-assembly.

* * * * *